United States Patent [19]

Hika et al.

[11] Patent Number: 5,428,232
[45] Date of Patent: Jun. 27, 1995

[54] FIELD EFFECT TRANSISTOR APPARATUS

[75] Inventors: Mitsuhiro Hika, Tokyo; Shinichi Tanaka, Kanagawa; Keigo Aga, Tokyo; Hidemi Takakuwa, Kanagawa, all of Japan

[73] Assignee: Sony Corporation, Tokyo, Japan

[21] Appl. No.: 246,464

[22] Filed: May 18, 1994

Related U.S. Application Data

[63] Continuation of Ser. No. 981,538, Nov. 25, 1992, abandoned.

[30] Foreign Application Priority Data

Nov. 28, 1991 [JP] Japan .................................. 3-314274
Nov. 30, 1991 [JP] Japan .................................. 3-339577
Dec. 19, 1991 [JP] Japan .................................. 3-354730

[51] Int. Cl.⁶ ..................... H01L 29/78; H01L 27/06; H03F 1/00
[52] U.S. Cl. ........................ 257/256; 257/280; 257/281; 257/282; 257/283; 257/601; 257/613; 257/910
[58] Field of Search ............... 257/280, 281, 282, 283, 257/256, 601, 613, 910

[56] References Cited

FOREIGN PATENT DOCUMENTS

| | | | |
|---|---|---|---|
| 6114373 | 9/1981 | Japan | 257/280 |
| 6133875 | 10/1981 | Japan | 257/280 |
| 6140667 | 11/1981 | Japan | 257/280 |
| 8147080 | 9/1983 | Japan | 257/280 |

*Primary Examiner*—William L. Sikes
*Assistant Examiner*—Fetsum Abraham
*Attorney, Agent, or Firm*—Hill, Steadman & Simpson

[57] ABSTRACT

A dual gate field effect transistor including first and second gates comprises a conductive region, wherein a potential difference between a second gate electrode section and the conductive region is larger than that between the second gate electrode section and a channel operation region.

15 Claims, 14 Drawing Sheets

FIELD EFFECT TRANSISTOR APPARATUS

This is a continuation of application Ser. No. 07/981,538, filed Nov. 25, 1992, abandoned on May 18, 1994.

BACKGROUND OF THE INVENTION

1. Field of the Invention

The present invention relates to a junction field effect transistor.

2. Description of the Prior Art

Junction field effect transistors such as GaAs Schottky (barrier) gate field effect transistors, for example, have a Schottky barrier formed on a gate region to control the flow of carriers by reversely biasing the Schottky barrier to change a width of a spatial electric charge region.

FIG. 1 of the accompanying drawings shows a conventional GaAs Schottky (barrier) gate field effect transistor. As shown in FIG. 1, two N-type high concentration regions (low resistance regions) 2 and 3 are formed on the surface of a semi-insulating GaAs substrate 1. An N-type low concentration region (channel region) 4 is formed between these low resistance regions 2 and 3. A P-type high concentration region 5 serving as a gate PN junction Ja is formed on the channel region 4. A drain electrode 6 and a source electrode 7 are respectively formed on the two low resistance regions 2 and 3 in an ohmic-contact fashion. A gate electrode 8 is formed on the P-type high concentration region 5 in a Schottky-contact fashion.

In the illustrated example, a ground potential Vss is applied to the source electrode 7 and a negative potential $V_G$ is applied to the source of the gate electrode 8 such that a PN junction Ja formed by the channel region 4 and the high concentration region 5 is reversely biased. A positive potential $V_D$ is applied to the drain electrode 6.

By the gate voltage $V_G$ applied to the gate electrode 8, the spatial electric charge region is downwardly widened from the gate. As a consequence, a passage (channel) of electrons flowing from the source to the drain is modulated by the depth of the spatial electric charge region and the drain current also is controlled by the gate voltage $V_G$. An equivalent circuit of the Schottky gate field effect transistor is illustrated in FIG. 2 of the accompanying drawings.

It is customary that a cut-off frequency $f_T$ must be increased to increase the resistance ratio of the input and output in order to improve a high frequency characteristic of the Schottky gate field effect transistor. Accordingly, the characteristics of the junction field effect transistor are improved more if the gate length is shorter and a spacing between the gate and the source is narrower.

If the gate length is reduced, then an energy per unit area is increased, which lowers an electrostatic strength. Consequently, the transistor is considerably lowered in reliability and in service life.

The gate of a junction dual gate field effect transistor has the following problems.

As shown in FIG. 3 of the accompanying drawings, around a protecting diode 15 connected between a connection second gate connection electrode 19 and a source electrode 14, there are generated electric lines of force 18 which are directed from the second gate connection electrode 19 having a high potential to the source electrode 14 having a low potential.

The electric line of force 18 thus generated in the above direction exert a bad influence on the channel region beneath the gate electrode 16 within an active region 17, thereby cyclically changing a ratio of the change of a drain current versus the change of the first gate voltage, i.e., transconductance (hereinafter simply referred to as Gm).

The cyclic change of Gm makes the characteristic of a semiconductor apparatus 20 unstable and the semiconductor apparatus 20 cannot substantially achieve a desired amplification action.

Furthermore, study of the report reveals that, when a bias to the second gate is at a certain condition, a drain current ($I_D$) and a drain conductance (gm) are vibrated at a frequency of 1 Hz to 1 kHz (see "Low Frequency Oscillation in GaAs IC's", Daniel Miller et al, GaAs IC Symposium-31, pp. 31-34, 1985).

A cause for this is not perfectly explained yet and is considered as follows: That is, if a leakage current is injected into the substrate from the source section of the field effect transistor (FET) or the electrode section of the drain or the electrode section of the gate, then this leakage current modulates the potential of the channel operation region/substrate interface of the FET. As a result, the drain current $I_D$ or drain conductance gm are vibrated at a low frequency.

In a dual gate field effect transistor in which a protecting diode for improving a withstand voltage property is formed on the second gate, it is frequently observed that the low frequency vibration of the drain current $I_D$ and the drain conductance gm takes place remarkably. A cause for this can be explained as follows. Generally, the dual gate FET is utilized in the state that the second gate is at a DC bias condition of 0 to 3 V. Therefore, if the second gate is positively biased strongly, then the leakage current, flowing into the substrate through the protecting diode provided on the second gate, is increased so that the drain current $I_D$ flowing through the channel operation region is modulated or the low frequency vibration of the drain conductance gm occurs.

OBJECTS AND SUMMARY OF THE INVENTION

Therefore, it is a general object of the present invention to provide an improved field effect transistor apparatus in which the aforesaid shortcomings and disadvantages encountered with the prior art can be eliminated.

An object of the present invention is to provide a dual gate field effect transistor in which a low frequency vibration of a drain current $I_D$ or drain conductance gm due to a leakage current from an electrode section of a gate or from a protecting diode formed on the electrode section of the gate can be avoided to provide a stable transistor characteristic.

Another object of the present invention is to provide a semiconductor apparatus which can provide a stable transconductance Gm.

A further object of the present invention is to provide a junction field effect transistor in which a transistor characteristic (high frequency characteristic) can be improved without degrading reliability and service life of the transistor.

According to a first aspect of the present invention, there is provided a dual gate field effect transistor including first and second gates which comprises a conductive region, wherein a potential difference between a second gate electrode portion and the conductive region is larger than that between the second gate electrode portion and a channel operation region.

According to a second aspect of the present invention, there is provided a dual gate field effect transistor including a first gate, a second gate, a source portion, a drain portion and a channel operation region which comprises a conductive region. The conductive region is disposed at least in an area encircled by two straight lines passing an end portion of a gate of the channel operation region and a second gate electrode portion and whose included angle is maximized. The second gate electrode portion and a potential difference between the second gate electrode portion and the conductive region is larger than that between the second gate electrode portion and the channel operation region.

According to a third aspect of the present invention, there is provided a dual gate field effect transistor including a first gate, a second gate having a protecting diode formed on its electrode portion, a source portion, a drain portion and a channel operation region which comprises a conductive region. The conductive region is disposed between the protecting diode and an end portion of a gate side of the channel operation region. A potential difference between a second gate electrode portion and the conductive region is larger than that between the second gate electrode portion and the channel operation region.

In accordance with a fourth aspect of the present invention, there is provided a semiconductor apparatus which comprises an active region in which a drain electrode is disposed on one side of a gate electrode portion including first and second gate electrodes. A source electrode is disposed on the other side of the gate electrode portion. A connection second gate electrode is disposed in the vicinity of the source electrode side of the active region so that the connection second gate electrode is conducted with the second gate electrode, and a protecting diode connected between the connection second gate electrode and the source electrode. The protecting diode is connected between the connection second gate electrode and the source electrode in such a fashion that electric lines of force generated around the protecting diode can be prevented from being directed at least in the direction of the active region side.

In accordance with a fifth aspect of the present invention, there is provided a junction field effect transistor which comprises a substrate, a low resistance region formed on the surface of the substrate, a drain electrode and a source electrode provided on the low resistance region, respectively, and a gate electrode formed on a channel region having a PN junction. At least one junction diode is formed on a low resistance region formed under the source electrode. A deriving electrode of the junction diode and the gate electrode are connected electrically.

As a sixth aspect of the present invention, there is provided a junction field effect transistor which comprises a substrate, a low resistance region formed on the surface of the substrate, a drain electrode and a source electrode provided on the low resistance region, respectively. First and second gate electrodes are formed on a channel region having first and second PN junctions. First and second junction diodes are formed on a low resistance region formed under the source electrode. A deriving electrode of the first junction diode and the first gate electrode are connected electrically and a deriving electrode of the second junction diode and the second gate electrode are connected electrically.

The above and other objects, features, and advantages of the present invention will become apparent from the following detailed description of illustrative embodiments thereof to be read in conjunction with the accompanying drawings.

DETAILED DESCRIPTION OF THE PREFERRED EMBODIMENTS

Figure 1:
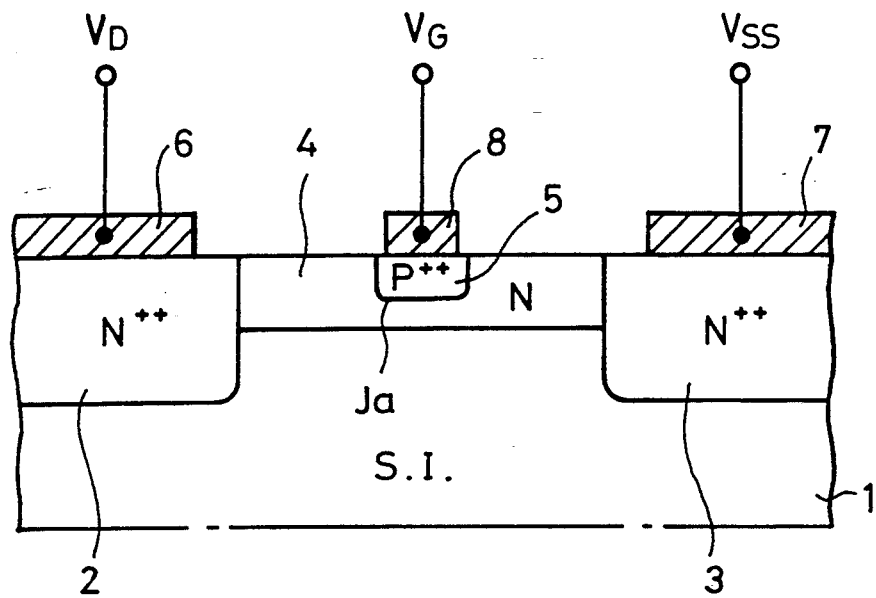
FIG. 1 is a diagrammatic view of a section showing a structure of a conventional junction field effect transistor.
Figure 2:
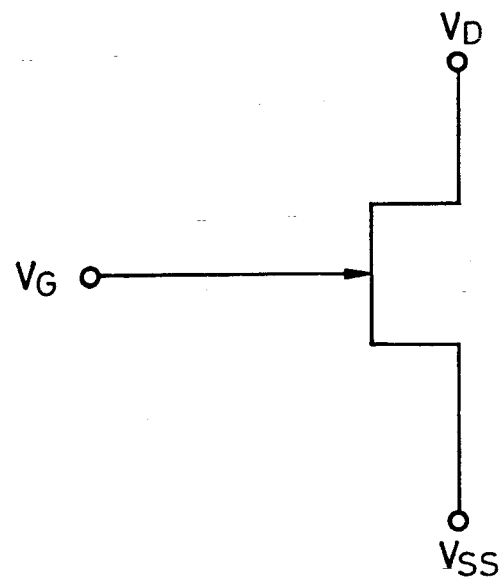
FIG. 2 is a diagram showing an equivalent circuit of the conventional junction field effect transistor shown in FIG. 1.
Figure 3:
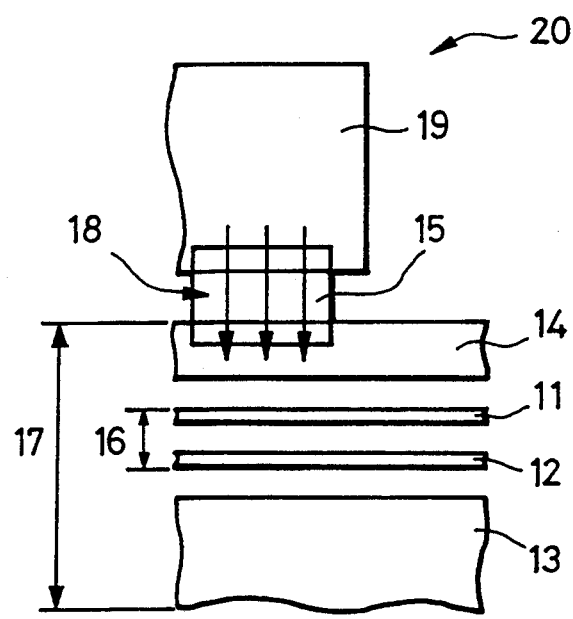
FIG. 3 is a schematic diagram of a second example of the prior art and illustrating the layout of electrodes of a dual gate junction field effect transistor.

Referring to the drawings in detail, and initially to FIG. 4, a first embodiment of the present invention will be described hereinafter.

Figure 4:
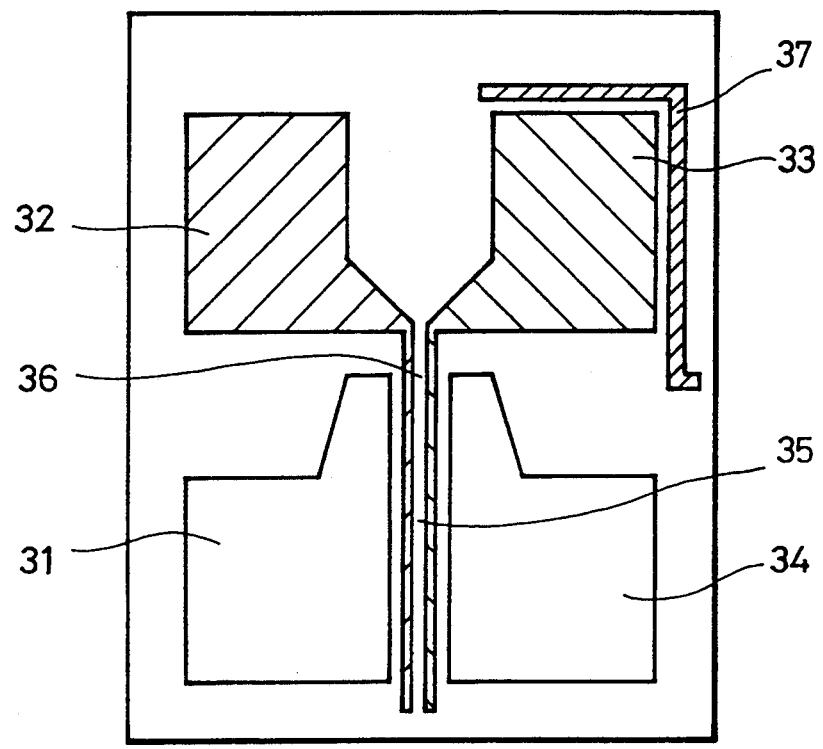
FIG. 4 is a schematic diagram showing a structure of a dual gate field effect transistor according to a first embodiment of the present invention.

FIG. 4 of the accompanying drawings shows a cross-sectional view of a structure of a dual gate field effect transistor (FET) according to the first embodiment of the present invention.

As shown in FIG. 4, the dual gate FET according to the first embodiment of the present invention comprises a source sections 31, a first gate electrode section 32, a second gate electrode section 33, a drain section 34 hand a channel operation region. This dual gate FET is characterized by a conductive region 37. The conductive region 37 can be formed such that an alloy layer such as Au, Ge, Ni, GaAs or metal layer such as Au, Al or the like is formed in ohmic-contact with a conductive layer formed of only an alloy layer such as Au, Ge, Ni, GaAs or by a high concentration electron injection technique. The conductive region 37 is disposed adjacent to a second gate electrode section 33. A potential difference $\Delta V_2$ between the second gate electrode section 33 and the conductive region 37 is selected to be larger than a potential difference $\Delta V_2$ between the second gate electrode section 33 and the channel operation region 35. As a consequence, most of electrons that are injected into the substrate through the second gate electrode section 33 or holes in the prior art are flowed into the conductive region 37 having a larger potential difference and which is near the substrate rather than the channel operation region 35.

Figure 5:
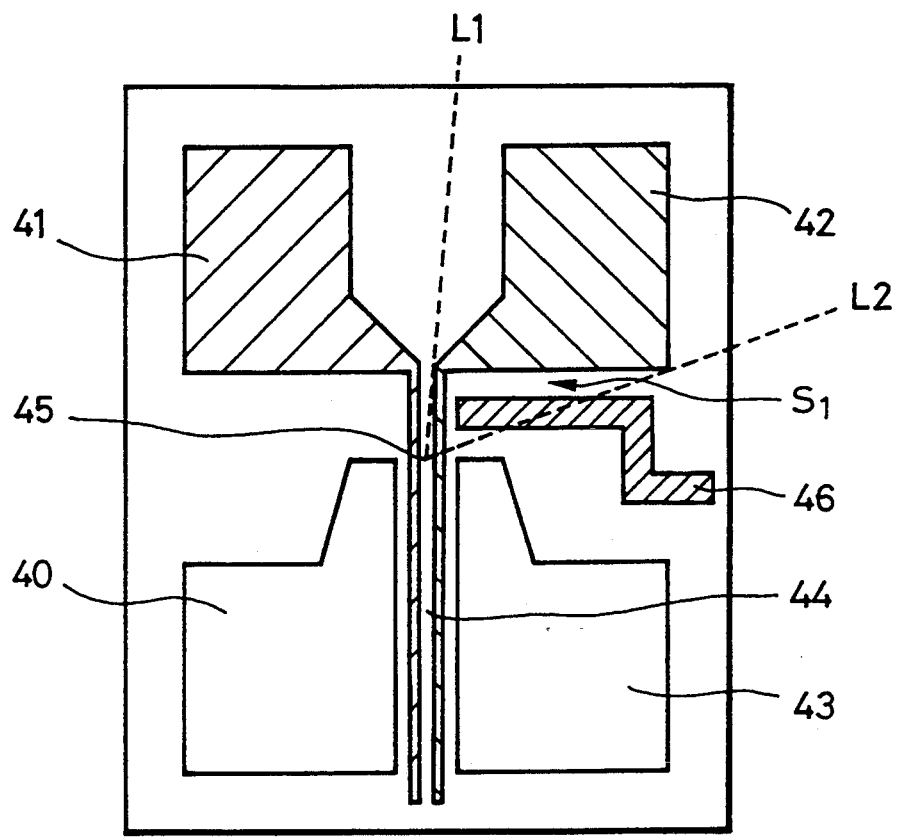
FIG. 5 is a schematic diagram showing a structure of the dual gate field effect transistor according to a second embodiment of the present invention.

FIG. 5 of the accompanying drawings shows a structure of the dual gate FET according to a second embodiment of the present invention. As shown in FIG. 5, the dual gate FET according to the second embodiment of the present invention comprises a source section 40, a first gate 41, a second gate electrode section 42, a drain section 43, a channel operation region 44 and a conductive region 46.

Let us assume two straight lines which pass an end portion of the channel operation region 44 and the second gate electrode section 42. The included angle of straight lines $L_1$, $L_2$ is shown between the broken lines in FIG. 5. As shown in FIG. 5, the conductive region 46 is disposed within an area $S_1$ encircled by the straight lines $L_1$, $L_2$ and the second gate electrode section 42. Therefore, the channel operation region 44 is isolated from the second gate electrode section 42 by the conductive region 46.

Figure 6:
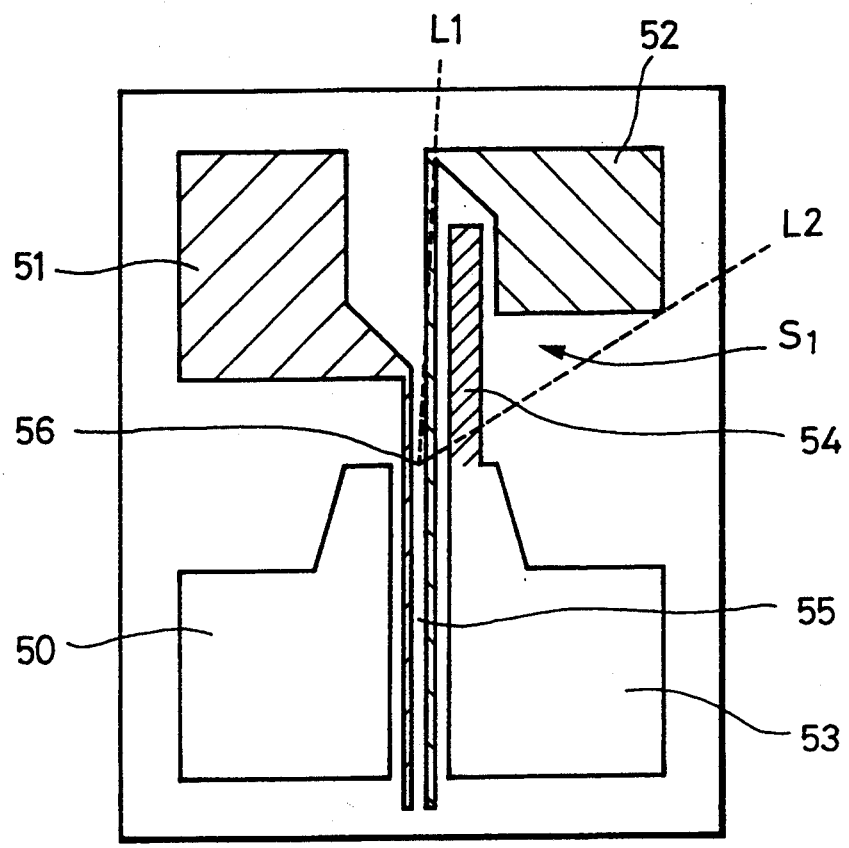
FIG. 6 is a schematic diagram showing a structure of the dual gate field effect transistor according to a third embodiment of the present invention.

FIG. 6 of the accompanying drawings shows a structure of the dual gate FET according to a third embodiment of the present invention. In the dual gate FET shown in FIG. 6, a conductive region is formed of a drain electrode section 53 extended portion 54 (hereinafter simply referred to as an extended portion) shown hatched. As shown in FIG. 6, the extended portion 54 is extended in substantially parallel to the longitudinal direction of the channel operation region 55.

Figure 7:
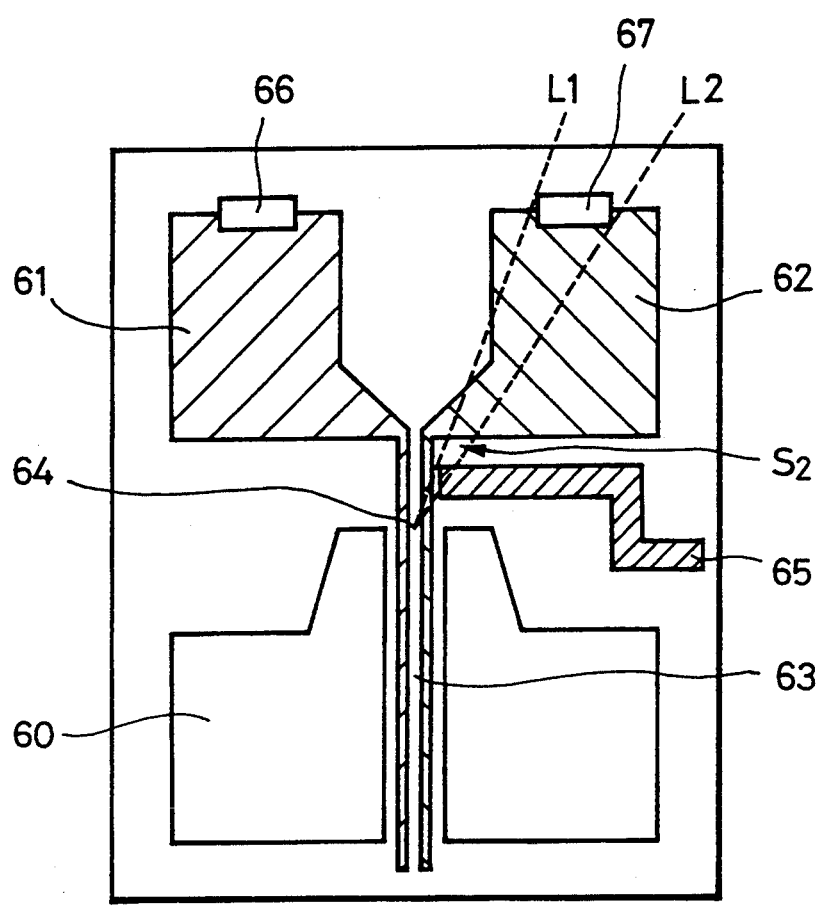
FIG. 7 is a schematic diagram showing a structure of the dual gate field effect transistor according to a fourth embodiment of the present invention.

FIG. 7 of the accompanying drawings shows a structure of the dual gate FET according to a fourth embodiment of the present invention. As shown in FIG. 7, the dual gate FET according to the fourth embodiment of the present invention comprises the source section 60, the first gate electrode section 61, the second gate electrode section 62, the drain section 62, the channel operation region 63 and a conductive region 65. A protecting diode 66 is disposed on the first gate electrode section 61. A protecting diode 67 is disposed on a second gate electrode section 62. The conductive region 65 is disposed between the protecting diode 67 and an end portion 64 on the gate side of the channel operation region 63.

Let us assume two straight lines which pass the end portion 64 of the channel operation region 63 and the protecting diode 67. Straight lines $L_1$, $L_2$ shown by broken lines in FIG. 7 define an included angle. As shown in FIG. 7, the conductive region 65 is disposed within an area $S_2$ encircled by the straight lines $L_1$, $L_2$ and the second gate electrode section 62. That is, the channel operation region 63 is isolated from the protecting diode 67 by the conductive region 65.

Figure 8:
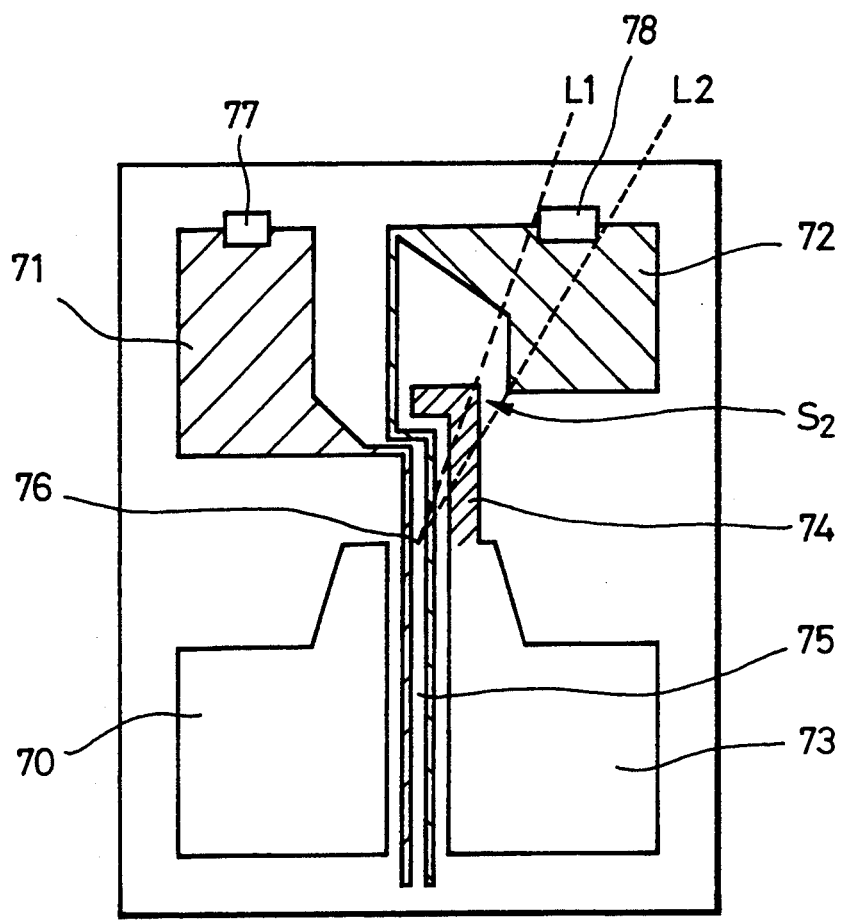
FIG. 8 is a schematic diagram showing a structure of the dual gate field effect transistor according to a fifth embodiment of the present invention.

FIG. 8 of the accompanying drawings shows a structure of the dual gate FET according to a fifth embodiment of the present invention. In the dual gate FET shown in FIG. 8, the conductive region is formed of a drain electrode section 73 extended portion 74 shown hatched. As shown in FIG. 8, the extended portion 74 is extended from the drain electrode section 73 and the top thereof is curved as a hook. An end portion of the conductive region is extended to the outside of the area $S_2$. A channel operation region 75 is isolated from a protecting diode 78 by the conductive region.

In the above respective embodiments of the present invention, the potential difference $\Delta V_1$ between the second gate electrode section and the conductive region is selected to be larger than the potential difference $\Delta V_2$ between the second gate electrode section and the channel operation region. As a consequence, most of electrons that are injected into the substrate through the second gate electrode section or holes in the prior art are flowed into the conductive region having a larger potential difference and which is near the substrate rather than the channel operation region.

In view of the dual gate field effect transistors of the present invention are described so far, it is needless to say that the present invention is not limited to those embodiments and various modifications and variations are possible.

The conductive region or the extended portion of the conductive region may be formed as any shape. Moreover, the potential difference $\Delta V_1$ between the second gate electrode section and the conductive region and the potential difference $\Delta V_2$ between the second gate electrode section and the channel operation region depend upon the layout and operation conditions of respective elements and parts of the dual gate FET.

According to the present invention, the leakage current from the second gate electrode section or from the protecting diode is flowed into the conductive region. Then, the probability that the leakage current will flow into the channel operation region can be decreased considerably. Hence, the leakage current can be prevented from acting on the channel operation region. Therefore, under normal conditions, the low frequency vibration of the drain current $I_D$ or drain conductance gm can be avoided, thereby making it possible to provide the dual gate field effect transistor with a stable transistor characteristic.

A sixth embodiment of the present invention will be described below.

Figure 9:
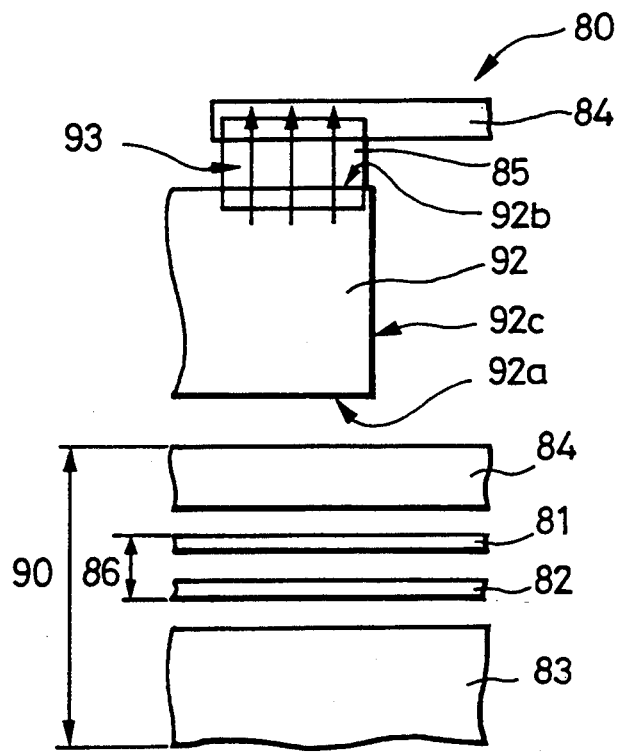
FIG. 9 is a diagram showing the layout of electrodes of the dual gate field effect transistor according to a sixth embodiment of the present invention.
Figure 10:
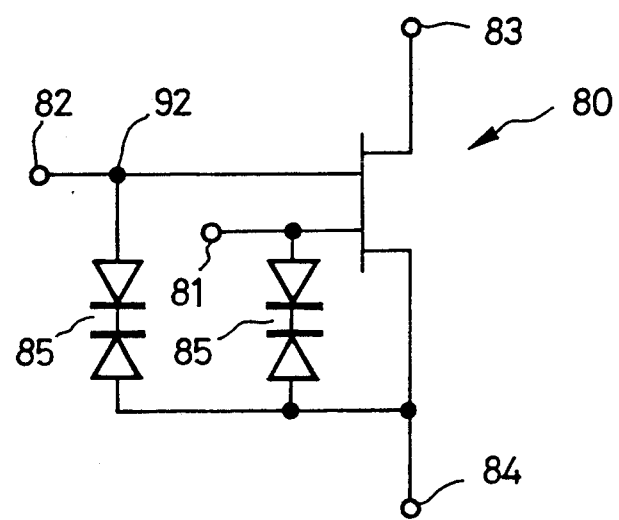
FIG. 10 is a diagram showing an equivalent circuit of the dual gate field effect transistor shown in FIG. 9.

FIGS. 9 and 10 of the accompanying drawings are used to explain a semiconductor apparatus according to the present invention. FIG. 9 is a schematic diagram showing the layout of electrodes of this semiconductor apparatus and FIG. 10 is a diagram showing an equivalent circuit of the semiconductor apparatus shown in FIG. 9.

As illustrated, in a semiconductor apparatus 80 of the present invention, a gate electrode section 86 includes a first gate electrode 81 and a second gate electrode 82. A dual gate FET is formed of an active region 90 that is composed of a drain electrode 83 provided on one side of the gate electrode section 86 and a source electrode 84 provided on the other side of the gate electrode section 86.

In the vicinity of the source electrode 84 of the active region 90, there is provided a second gate connection electrode 92 which is in the conducted state with the second gate connection electrode 82 (see FIG. 10). The second gate electrode 92 includes a substantially parallel side 92a near the source electrode 84 of the active region 90, a substantially parallel side 92b distant from the source electrode 84 of the active region 90 and a substantially vertical side 92c that connects these sides 92a, 92b.

The source electrode 84 is disposed near the side opposite to the active region 90 of the second gate connection electrode 92. A protecting diode 85 is connected between a source connection electrode 84a connection to the source electrode 84 and the side 92b of the second gate connection electrode 92.

An electric force shown by lines 93 that occurs around the protecting diode 85 thus disposed is generated from the second gate connection electrode 92 having a high potential to the source electrode 84 having a low potential when a plus bias is applied to the second gate electrode 82. Accordingly, the electric lines of force 93 can be prevented from being directed at least toward the active region 90.

Therefore, electric charges forming the electric lines of force 93 can be prevented from entering the gate electrode section 86, thereby protecting the channel region from a bad influence.

The semiconductor apparatus according to a seventh embodiment of the present invention will be described with reference to the drawings.

Figure 11:
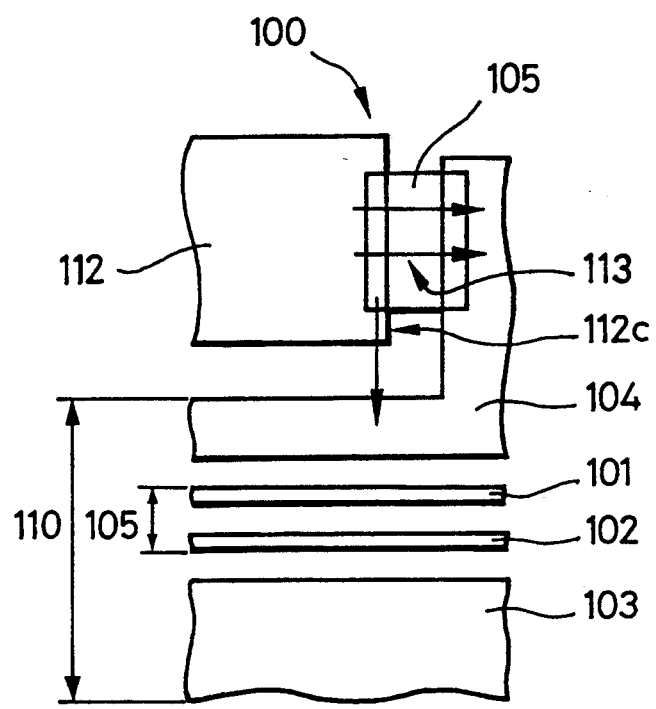
FIG. 11 is a diagram showing the layout of electrodes of the dual gate field effect transistor according to a seventh embodiment of the present invention.

FIG. 11 of the accompanying drawings shows the layout of electrodes according to the seventh embodiment of the present invention. As shown in FIG. 11, a source electrode 104 of an active region 110 is extended in the form of a source connection electrode 104a substantially parallel to a side 112c of a second gate connection electrode 112. A protecting diode 105 is connected between the source connection electrode 104a and the side 112c of the second gate connection electrode 112.

Electric lines of force 113 that occur around the protecting diode 105 thus connected is directed in the direction substantially parallel to the gate electrode section 105 disposed in the active region 110.

Accordingly, as compared with the electrode layout in which the electric lines of force are directed toward the active region, the electrode layout of this embodiment becomes such that a bad influence can be substantially prevented from being exerted upon the channel region formed beneath the gate electrode section.

Some electric charges, however, are flowed toward the active region due to the diffusion of electric lines of force so that a bad influence tends to be exerted upon the channel region as compared with the electrode layout shown in FIG. 9.

Therefore, when the dual gate FET is utilized with the low second gate voltage, the electric lines of force can be substantially prevented from being exerted upon the channel region.

Since this electrode layout can reduce an electrode area as compared with the electrode layout shown in FIG. 9, it is effective for making the semiconductor apparatus 100 small in size.

In accordance with any of the above embodiments, since the protecting diode is connected with the condition that the electric lines of force generated around the protecting diode can be avoided from being directed at least toward the active region, an amount of electric charges entered into the channel region formed under the gate electrode section can be reduced.

While the pnp type protecting diode is used as described above, the present invention is not limited thereto and may be applied to a field effect transistor that utilizes an npn-type protecting diode.

As described above, according to the semiconductor apparatus of the present invention, the effects described hereafter can be achieved.

Electric charges generated around the protecting diode and which exert a bad influence upon the channel region formed under the gate electrode section can be substantially prevented from entering the channel region. The cyclic change of the drain conductance gm can therefore be prevented.

Hence, the semiconductor apparatus of the present invention becomes stable in drain conductance gm, which can provide high reliability.

An eighth embodiment of the present invention will be described.

Figure 12:
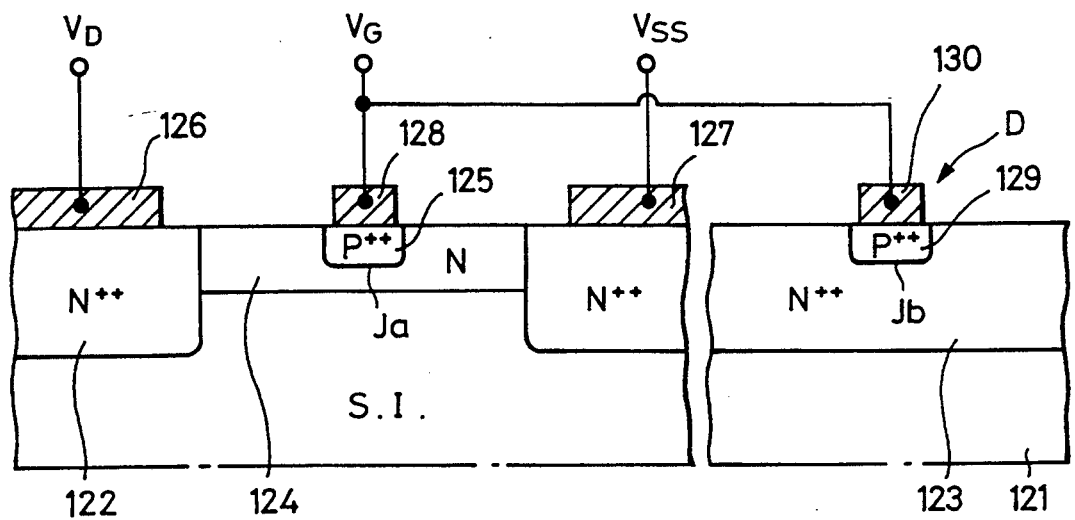
FIG. 12 is a diagrammatic view of a section showing a structure of a Schottky barrier gate field effect transistor according to an eighth embodiment of the present invention.

FIG. 12 is a diagrammatic view of a section showing a structure of a junction field effect transistor according to the eighth embodiment of the present invention, i.e., N-channel GaAs Schottky (barrier) gate field effect transistor (hereinafter simply referred to as a transistor) Tr1.

As shown in FIG. 12, the transistor Tr1 includes two N-type high concentration regions (low resistance regions) 122, 123 formed on the surface of a semi-insulating GaAs substrate 121 and also an N-type low concentration region (channel region) 124 formed between these low resistance regions 122, 123. On the channel region 124, there is formed a P-type high concentration region 125 which serves as a gate PN junction Ja. A drain electrode 126 and a source electrode 127 are formed on the two low resistance regions 122, 123 in an ohmic-contact fashion and a gate electrode 128 is formed on the P-type high concentration region 125 in a Schottky-contact fashion.

In the illustrated example, a ground potential Vss is applied to the source electrode 127 and a negative potential $V_G$ is applied to the source of the gate electrode 128 so that the PN junction based on the channel region 124 and the high concentration region 125 is reversely biased. A positive potential $V_D$ is applied to the drain electrode 126.

By the gate voltage $V_G$ applied to the gate electrode 128, the spatial electric charge region is widened downwardly from the gate so that a passage (channel) of electrons flowing from the source to the drain is modulated by the depth of the spatial electric charge region and the drain current also is controlled by the gate voltage $V_G$.

Figure 13:
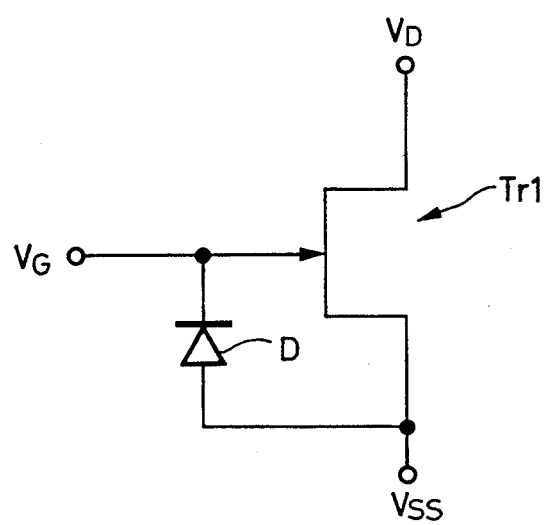
FIG. 13 is a diagram showing an equivalent circuit of the Schottky barrier gate field effect transistor shown in FIG. 12.

According to this embodiment, one P-type high concentration region 129 is formed on the low resistance region 123 formed under the source electrode 127, thereby forming a junction diode D based on the PN junction Jb. A deriving electrode 130 is formed on the P-type high concentration region 129 of the junction diode D and the deriving electrode 130 and the gate electrode 128 are connected electrically. An equivalent circuit of this transistor Tr1 is illustrated in FIG. 13 of the accompanying drawings.

Figure 14:
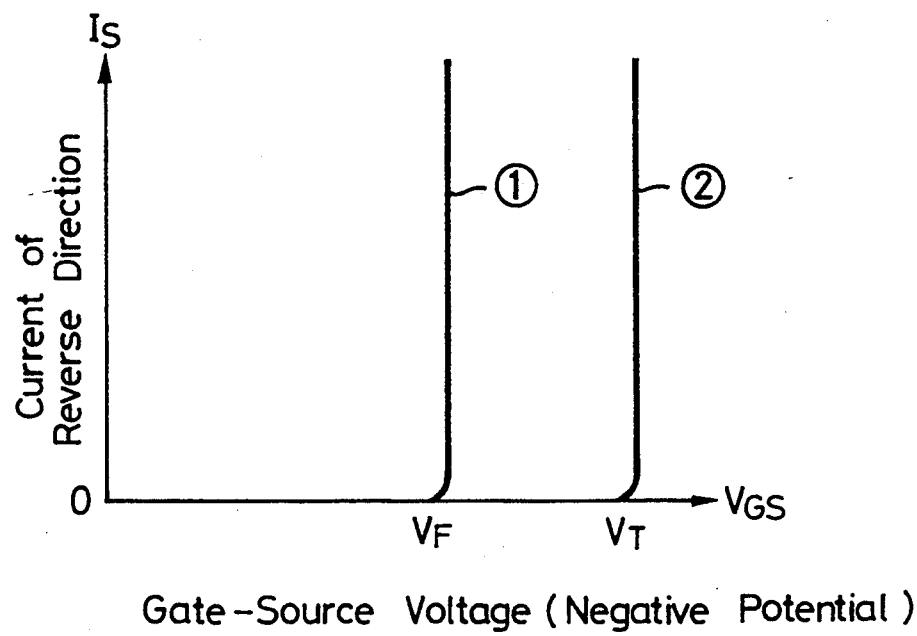
FIG. 14 is a characteristic graph showing a reverse withstand voltage characteristic of the Schottky barrier gate field effect transistor shown in FIG. 12.

Operation of the transistor according to this embodiment will be described with reference to FIG. 14 of the accompanying drawings. FIG. 14 shows a reverse withstanding voltage characteristic of the transistor Tr1 wherein the abscissa represents a gate-source voltage $V_{GS}$ and the ordinate represents a reverse direction current Is. In the graph of FIG. 14, a curve ① represents the reverse withstanding voltage characteristic of the junction diode and a curve ② represents the reverse withstanding voltage characteristic of the transistor. As will be clear from FIG. 14, a breakdown voltage $V_F$ of the junction diode D is set to be lower than a breakdown voltage $V_T$ of the transistor Tr1.

In the normal condition, the transistor Tr1 is operated in an operation potential width (in a range of from +1 V to −1 V). Thus, a passage (channel) of electrons flowing from the source to the drain is modulated by the depth of the spatial electric charge region and the drain current also is controlled by the gate voltage $V_G$.

When the gate length, for example, is designed to be short in order to improve a high frequency characteristic, an energy per unit area is increased so that a high potential in the negative direction tends to be applied to the gate electrode 128. Therefore, when a high potential larger than the breakdown voltage $V_T$ is applied to the gate electrode 128, a junction destruction occurs in the PN junction Ja of the transistor Tr1.

According to this embodiment, however, since the junction diode D composed of the PN junction Jb is formed on the low resistance region 123, the junction D is broken down by a voltage (breakdown voltage $V_F$ of the junction diode) which is not yet reached to the breakdown voltage $V_T$ of the transistor Tr1, thereby absorbing the energy applied to the transistor Tr1. Consequently, a high potential larger than the voltage $V_F$ is not applied to the PN junction Ja of the transistor Tr1 any more, thereby avoiding the junction of the transistor Tr1 from being destroyed.

Figure 15:
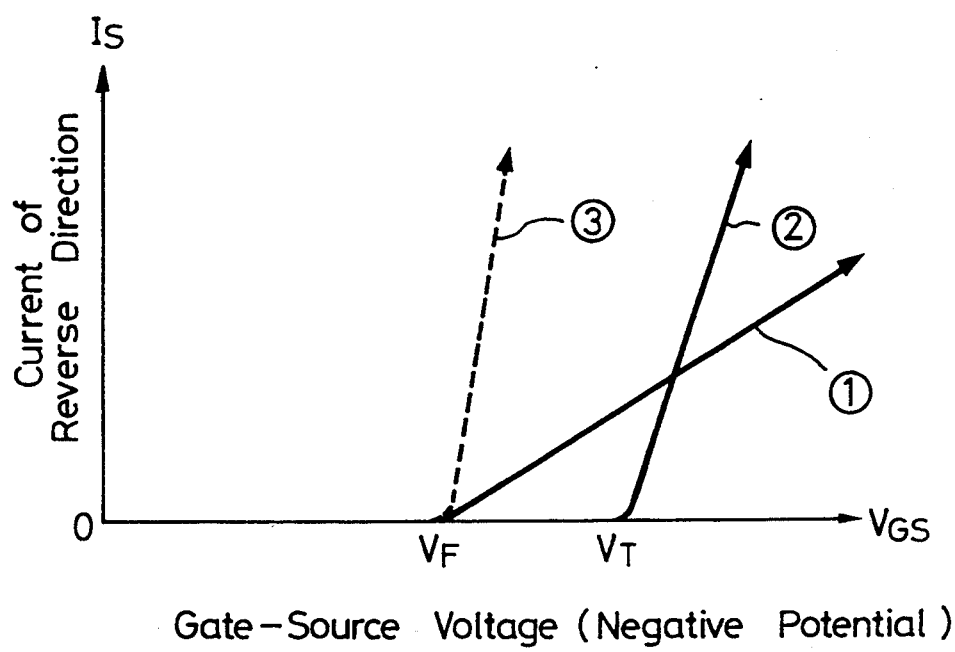
FIG. 15 is a characteristic graph showing a reverse withstand voltage characteristic of the Schottky barrier gate field effect transistor shown in FIG. 12 under the condition such that the junction diode thereof is held at high resistance.

When the PN junction Jb forming the junction diode D is at high resistance, or when the resistance of the low resistance region under the source electrode is high, as shown in FIG. 15, the curves ① and ② representative of the reverse withstanding voltage characteristics of the junction diode D and the transistor Tr1 are inclined in the upper right-hand directions. At that time, when the inclination of the reverse withstand voltage curve ① concerning the junction diode D becomes smaller than that of the reverse withstanding voltage curve ② of the transistor Tr1 so that the two curves ① and ② cross each other, a voltage larger than the breakdown voltage $V_T$ is applied to the transistor Tr1, resulting in the junction of the transistor Tr1 being destroyed.

For this reason, to effectively prevent the junction destruction of the transistor Tr1, it is important that the resistance of the PN junction Jb forming the junction diode D is selected to be smaller than that of the PN junction Ja in the channel region of the transistor Tr1. Therefore, the reverse withstanding voltage curve concerning the junction diode D is arranged so as not to cross the reverse withstanding voltage curve ② as shown by a broken line ③, for example. That is, silicon (Si) is implanted on the region 123 extending from the underside of the source electrode 127 to the junction diode D, thereby providing the low resistance region.

According to the eighth embodiment of the present invention, one junction diode D is formed on the low resistance region 123 formed under the source electrode 127 and the deriving electrode 130 and the gate electrode 128 of this junction diode D are connected electrically. Further, the resistance of the PN junction Jb constructing the junction transistor D is set to be smaller than that of the PN junction Ja in the channel region 124. Therefore, even if the high potential (high potential higher than the breakdown voltage $V_T$) is applied to the gate electrode 128 in accordance with the reduction of the gate length, this potential is absorbed by the junction diode D. Hence, a breakdown phenomenon of the transistor Tr1 due to the high potential can be avoided, which lead to the reduction of the gate length without causing the breakdown phenomenon. Thus, the high frequency characteristic of the transistor itself can be improved effectively.

Figure 16:
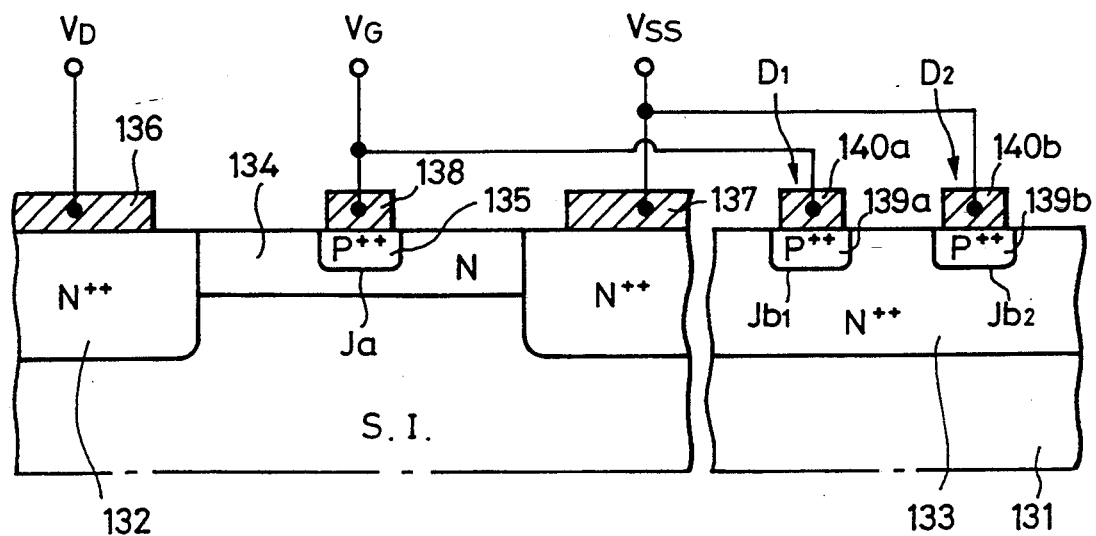
FIG. 16 is a diagrammatic view of a section showing a structure of a junction gate field effect transistor according to a ninth embodiment of the present invention.

A ninth embodiment that is a modified example of the eighth embodiment where the junction diode D is formed as a so-called back-to-back structure will be described with reference to FIGS. 16 and 17.

Although a transistor Tr2 according to the ninth embodiment that is the modified example of the eighth embodiment has substantially the same structure as that in the seventh embodiment, the transistor Tr2 is different in that two P-type high concentration regions 139a, 139b are formed on a low resistance region 133 formed under the source electrode 137 and that the first and second junction diodes $D_1$ and $D_2$ are formed on the basis of the first and second PN junctions $Jb_1$ and $Jb_2$.

Figure 17:
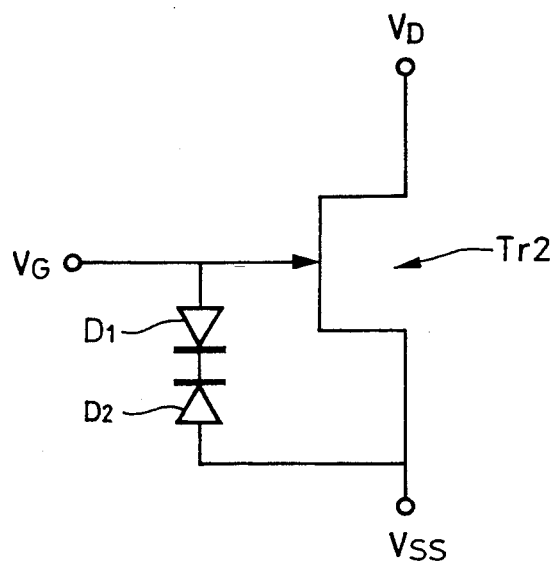
FIG. 17 is a schematic diagram showing an equivalent circuit of the junction gate field effect transistor shown in FIG, 16.

Of these junction diodes $D_1$ and $D_2$, a deriving electrode 140a of the first junction diode $D_1$ and the gate electrode 138 of the transistor Tr2 are connected electrically and a deriving electrode 140b of the second junction diode $D_2$ and the source electrode 137 of the transistor Tr2 are connected electrically, thereby allowing the junction diodes $D_1$ and $D_2$ to have a so-called back-to-back structure as shown in the equivalent circuit of FIG. 17. Also in this modified example, resistance of each of the PN junctions $Jb_1$ and $Jb_2$ is set to be smaller than that of the PN junction Ja in the channel region 134 of the transistor Tr2.

According to the ninth embodiment of the present invention, similarly to the eighth embodiment, a breakdown phenomenon of the transistor Tr2 due to the high potential can be avoided and the high frequency characteristic of the transistor Tr2 itself can be improved effectively.

Figure 18:
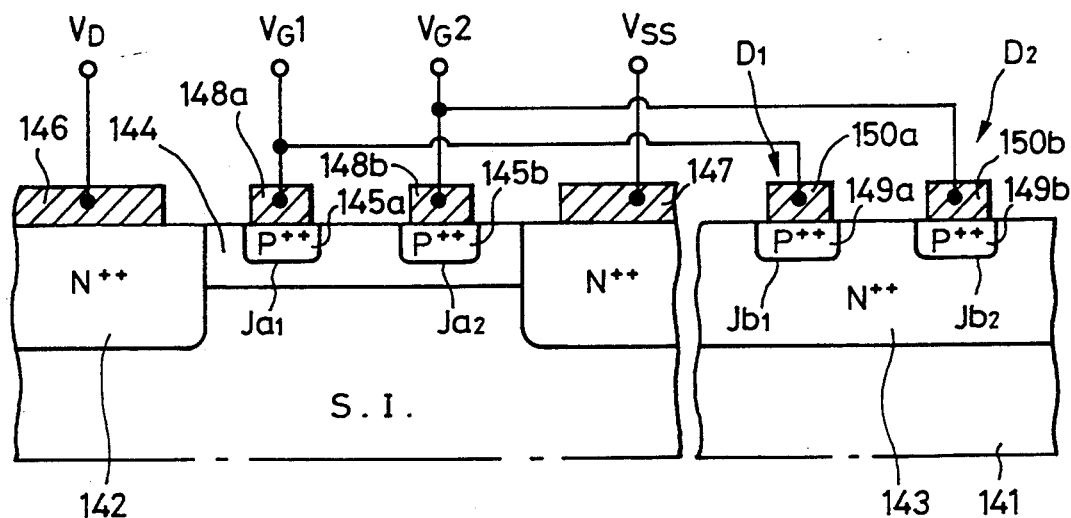
FIG. 18 is a diagrammatic view of a section showing a structure of a junction dual gate field effect transistor according to a tenth embodiment of the present invention.
Figure 19:
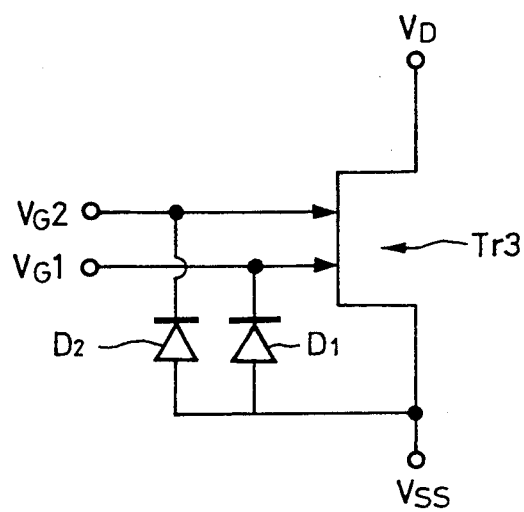
FIG. 19 is a schematic diagram showing an equivalent circuit of the junction dual gate field effect transistor shown in FIG. 18.

A tenth embodiment in which a transistor is formed as a dual gate transistor will be described with reference to FIGS. 18 and 19.

Although a transistor Tr3 according to the tenth embodiment has substantially the same structure as that of the modified example of the above eighth embodiment, it is different in that two P-type high concentration regions 145a, 145b are formed on a channel region 144 and first and second PN junctions $Ja_1$ and $Ja_2$ are formed within the channel region 144. Gate electrodes 148a, 148b are formed on the P-type high concentration region 145a, 145b, respectively. Two P-type high concentration regions 149a, 149b are formed on a low resistance region 143 formed under a source electrode 147 and the first and second junction diodes $D_1$, $D_2$ are formed on the basis of the first and second PN junctions $Jb_1$, $Jb_2$.

Of these junction diodes $D_1$, $D_2$, a deriving electrode 150a of the first junction diode $D_1$ and a first gate electrode 148a are connected electrically and a deriving electrode 150b of the second junction diode $D_2$ and the second gate electrode 148b are connected electrically. Also in this embodiment, a resistance of each of the junctions $Jb_1$, $Jb_2$ is set to be smaller than that of the PN junctions $Ja_1$, $Ja_2$ in the channel region 144 of the transistor Tr2.

According to the tenth embodiment of the present invention, similarly to the eighth embodiment, a breakdown phenomenon of the transistor Tr3 due to the high potential can be avoided and a high frequency characteristic of the transistor Tr3 can be improved effectively.

Figure 20:
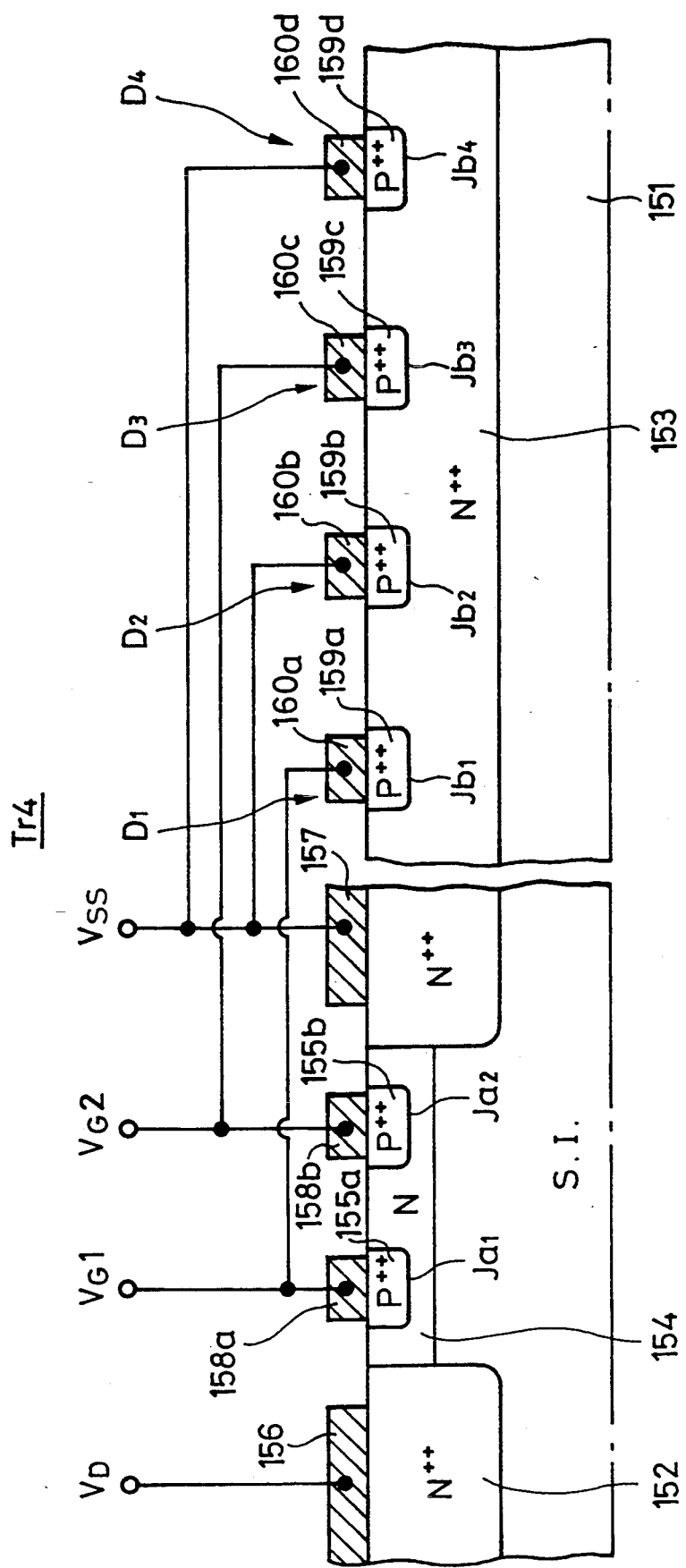
FIG. 20 is a diagrammatic view of a section showing a structure of a junction dual gate field effect transistor according to an eleventh embodiment of the present invention.
Figure 21:
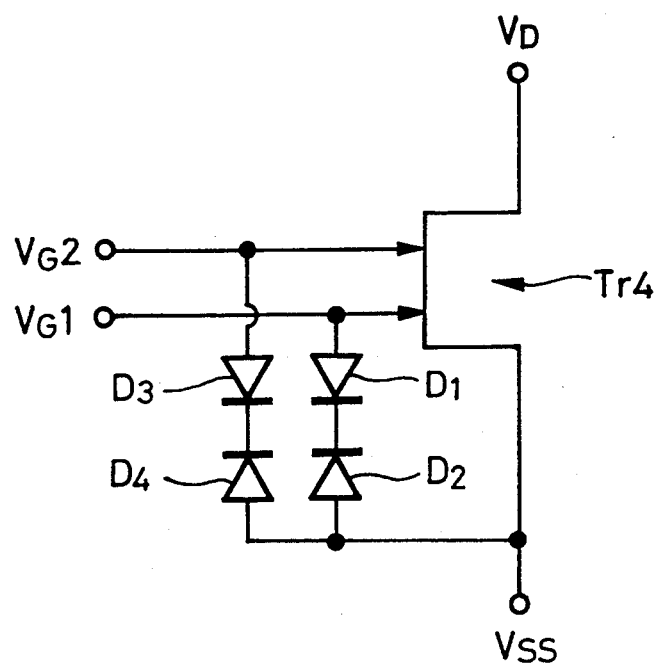
FIG. 21 is a schematic diagram showing an equivalent circuit of the junction dual gate field effect transistor shown in FIG. 20.

An eleventh embodiment that is a modified example in which the junction diode has a so-called back-to-back structure will be described with reference to FIGS. 20 and 21.

Although a transistor Tr4 has substantially the same structure as that of the tenth embodiment, it is different in that four P-type high concentration regions 159a to 159d are formed on a low resistance region 153 formed under a source electrode 157 and first to fourth junction diodes $D_1$ to $D_4$ based on first to fourth PN junctions $Jb_1$ to $Jb_4$ are formed. FIG. 21 shows an equivalent circuit of the transistor Tr4.

Of these junction diodes $D_1$ to $D_4$, a deriving electrode 160a of the first junction diode $D_1$ and a first gate electrode 158a are connected electrically and a deriving electrode 160c of the third junction diode $D_3$ and a second gate electrode 158b are connected electrically. Further, deriving electrodes 160b and 160d of the second and fourth junction diodes $D_2$ and $D_4$ and a source electrode 157 are connected electrically. Each of the first and second junction diodes $D_1$, $D_2$ and the third and fourth junction diodes $D_3$, $D_4$ has a so-called back-to-back structure similarly to the tenth embodiment. Also in the eleventh embodiment of the present invention, a resistance of each of the PN junctions $Jb_1$ to $Jb_4$ is set to be smaller than that of the first and second PN junctions $Ja_1$ and $Ja_2$ in the channel region 154 of the transistor Tr4.

According to the eleventh embodiment of the present invention, similarly to the tenth embodiment, the breakdown phenomenon of the transistor Tr4 due to the high potential can be avoided and therefore a high frequency characteristic of the transistor Tr4 itself can be improved effectively.

According to the junction field effect transistor of the present invention, the transistor characteristic (high frequency characteristic) can be improved without degrading reliability and service life of the transistor.

Having described preferred embodiments of the invention with reference to the accompanying drawings, it is to be understood that the invention is not limited to those precise embodiments and various changes and modifications could be effected therein by one skilled in the art without departing from the spirit or scope of the invention as defined in the appended claims.

What is claimed is:

1. A dual gate field effect transistor, comprising:
   a substrate having a source region and a drain region therein, and a channel operation region between the source and drain regions;
   first and second high concentration regions in the channel operation region and first and second gates disposed on the first and second high concentration regions;
   a source electrode over the source region and a drain electrode on the drain region;
   a first gate electrode section connecting to the first gate and a second gate electrode section connecting to the second gate;
   a conductive region adjacent to the second gate electrode section; and
   a potential difference between said second gate electrode section and said conductive region being larger than a potential difference between said second gate electrode section and said channel operation region.

2. A dual gate field effect transistor according to claim 1 wherein said second gate electrode section has a protecting diode connected thereto.

3. A dual gate field effect transistor, comprising:
   a substrate having a source region and a drain region therein, and a channel operation region between the source and drain regions;
   first and second high concentration regions in the channel operation region and first and second gates disposed on the first and second high concentration regions;
   a source electrode on the source region and a drain electrode on the drain region;
   a first gate electrode section connecting to the first gate and a second gate electrode section connecting to the second gate;
   a conductive region positioned at least in an area surrounded by said second gate electrode section and by two straight lines running from end sections of said first and second gates of said channel operation region to opposite sides of said second gate electrode section; and
   a potential difference between said second gate electrode section and said conductive region being larger than a potential difference between said second gate electrode section and said channel operation region.

4. A dual gate field effect transistor according to claim 3 wherein said conductive region is formed of an extended portion of said drain electrode.

5. A dual gate field effect transistor, comprising:
   a substrate having a source region and a drain region therein, and a channel operation region between the source and drain regions;
   first and second high concentration regions in the channel operation region and first and second gates disposed on the first and second high concentration regions;
   a source electrode on the source region and a drain electrode on the drain region;
   a first gate electrode section connecting to the first gate and a second gate electrode section connecting to the second gate;

said second gate electrode having a protecting diode connected thereto;

a conductive region positioned between said protecting diode and second gate electrode section and an end portion of said first and second gates of said channel operation region; and a potential difference between said second gate electrode section and said conductive region being greater than a potential difference between said second gate electrode section and said channel operation region.

6. A dual gate field effect transistor according to claim 5 wherein said conductive region is formed of an extended portion of said drain electrode.

7. A semiconductor apparatus, comprising:

a substrate having a source region and a drain region therein, and a channel operation region between the source and drain regions;

first and second high concentration regions in the channel operation region and first and second gates on the first and second high concentration regions;

a source electrode on the source region and a drain electrode on the drain region, a source connection electrode on the substrate connecting to and extending away from said source electrode, and said source electrode having a low potential applied thereto;

a second gate connection electrode on the substrate connecting to the second gate, said second gate having a high potential applied thereto higher than said low potential;

a protecting diode on the substrate connecting between said second gate connection electrode and said source connection electrode, said second gate connection electrode being positioned directly adjacent and alongside said source electrode on the substrate; and said protecting diode being oriented on the substrate such that electric lines of force generated at said protecting diode as a result of said low and high potentials applied thereto when said diode is operative being directed away from an active region of said transistor comprising said first and second gate electrodes and said channel operation region.

8. A transistor according to claim 7 wherein said lines of force are directed in an opposite direction from said active region.

9. A transistor according to claim 7 wherein said lines of force are directed parallel to a longitudinal extent of said first gate electrodes in said active region.

10. A junction field effect transistor, comprising:

a substrate;

low resistance regions formed on a surface of said substrate containing source and drain regions;

a channel region in said substrate between said source and drain regions;

a drain electrode on said drain region and a source electrode on said source region;

a high concentration region in said channel region forming a pn junction and a gate electrode on said high concentration region;

a junction diode formed in said low resistance region containing said source region, a deriving electrode on a region of said junction diode, and said deriving electrode and gate electrode being electrically connected; and a resistance of pn junction of said junction diode being smaller than a resistance of said pn junction of said high concentration region in said channel region.

11. A junction field effect transistor according to claim 10 wherein an additional junction diode is formed in said low resistance region having said source region, a deriving electrode of said additional junction diode being electrically connected to said source electrode.

12. A transistor according to claim 11 wherein pn junctions of the two junction diodes have a resistance which is less than a resistance of the pn junction of said high concentration region in said channel region.

13. A junction field effect transistor, comprising:

a substrate;

low resistance regions formed on a surface of said substrate containing source and drain regions;

a channel region in the substrate between the source and drain regions;

a drain electrode on the drain region and a source electrode on the source region;

first and second gate electrodes formed on first and second high concentration regions in said channel region, each high concentration region defining a pn junction;

first and second junction diodes formed in said low resistance region in which said source region is located, each of said first and second junction diodes having respective deriving electrodes;

the deriving electrode of said first junction diode and said first gate electrode being electrically connected and the deriving electrode of said second junction diode and said second gate electrode being electrically connected; and a resistance of the pn junctions of said first and second junction diodes being smaller than a resistance of the pn junctions of said first and second high concentration regions in said channel region.

14. A transistor according to claim 13 wherein third and fourth junction diodes are formed in said low resistance region in which said source region is formed, a deriving electrode of each of said third and fourth junction diodes connecting to said source electrode.

15. A transistor according to claim 14 wherein a resistance of said first through fourth junction diodes is less than a resistance of said pn junctions of said high concentration regions in said channel region.

* * * * *